United States Patent [19]
Lee et al.

[11] Patent Number: 5,904,493
[45] Date of Patent: May 18, 1999

[54] ACTIVE PIXEL SENSOR INTEGRATED WITH A PINNED PHOTODIODE

[75] Inventors: Paul P. Lee, Pittsford; Robert M. Guidash, Rush; Teh-Hsuang Lee, Webster; Eric G. Stevens, Rochester, all of N.Y.

[73] Assignee: Eastman Kodak Company, Rochester, N.Y.

[21] Appl. No.: 08/771,560

[22] Filed: Dec. 20, 1996

Related U.S. Application Data

[63] Continuation of application No. 08/421,173, Apr. 13, 1995, Pat. No. 5,625,210.
[51] Int. Cl.⁶ .......................... H01L 31/101; H01L 31/105
[52] U.S. Cl. .................................. 438/57; 438/73; 438/78; 257/292
[58] Field of Search .................................. 438/57, 59, 60, 438/73, 78; 257/291, 292

[56] References Cited

U.S. PATENT DOCUMENTS 5,262,871 11/1993 Wilder et al. ...................... 358/213.11
5,369,039 11/1994 Hynecek ............................... 437/2

FOREIGN PATENT DOCUMENTS 01243462 9/1989 Japan .......................... H01L 27/14

OTHER PUBLICATIONS

Paul P.Lee, et al., "An Active Pixel Sensor Fabricated Using CMOS/CCD Process Technology" Published at IEEE Workshop on Charge Couple Device and Advanced Image Sensors, in Dana Point California, on Apr. 20, 1995 as a handout.

*Primary Examiner*—Olik Chaudhuri
*Assistant Examiner*—William David Coleman
*Attorney, Agent, or Firm*—James D. Leimbach

[57] ABSTRACT

The optimization of two technologies (CMOS and CCD) wherein a pinned photodiode is integrated into the image sensing element of an active pixel sensor. Pinned photodiodes are fabricated with CCD process steps into the active pixel architecture. Charge integrated within the active pixel pinned photodiode is transferred into the charge sensing node by a transfer gate. The floating diffusion is coupled CMOS circuitry that can provide the addressing capabilities of individual pixels. Alternatively, a buried channel photocapacitor can be used in place of the pinned photodiode.

14 Claims, 5 Drawing Sheets

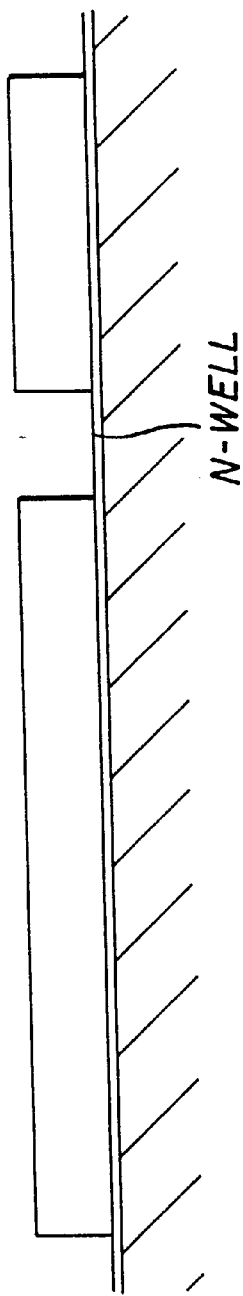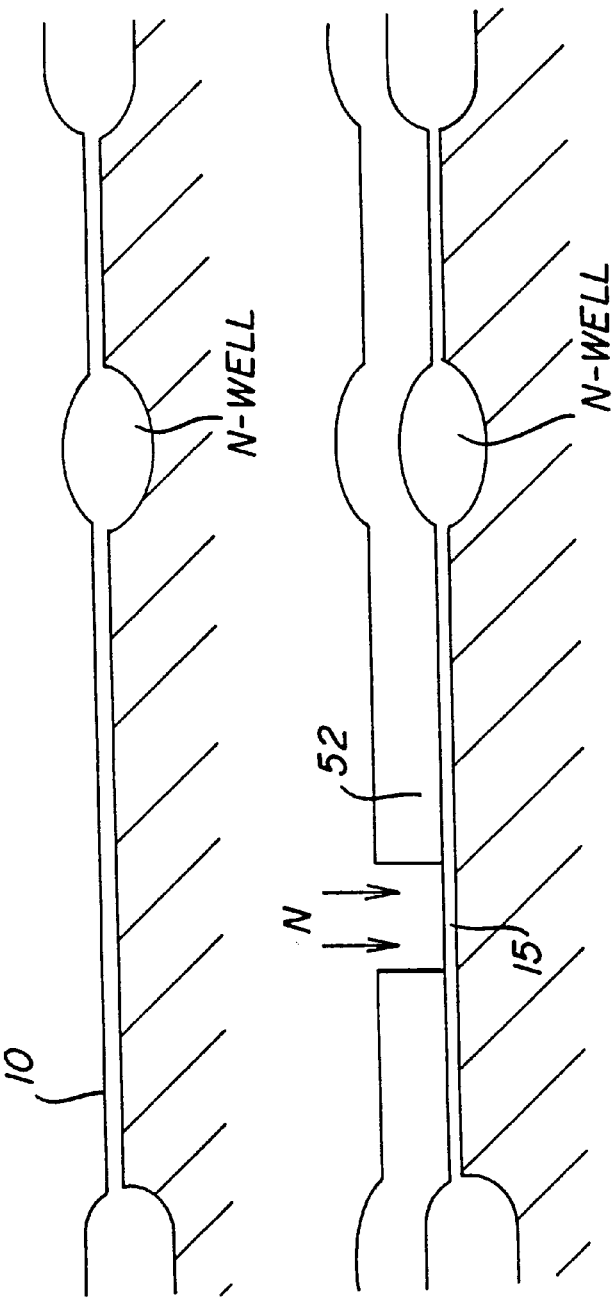
FIG. 3(b)
FIG. 3(c)
FIG. 3(d)

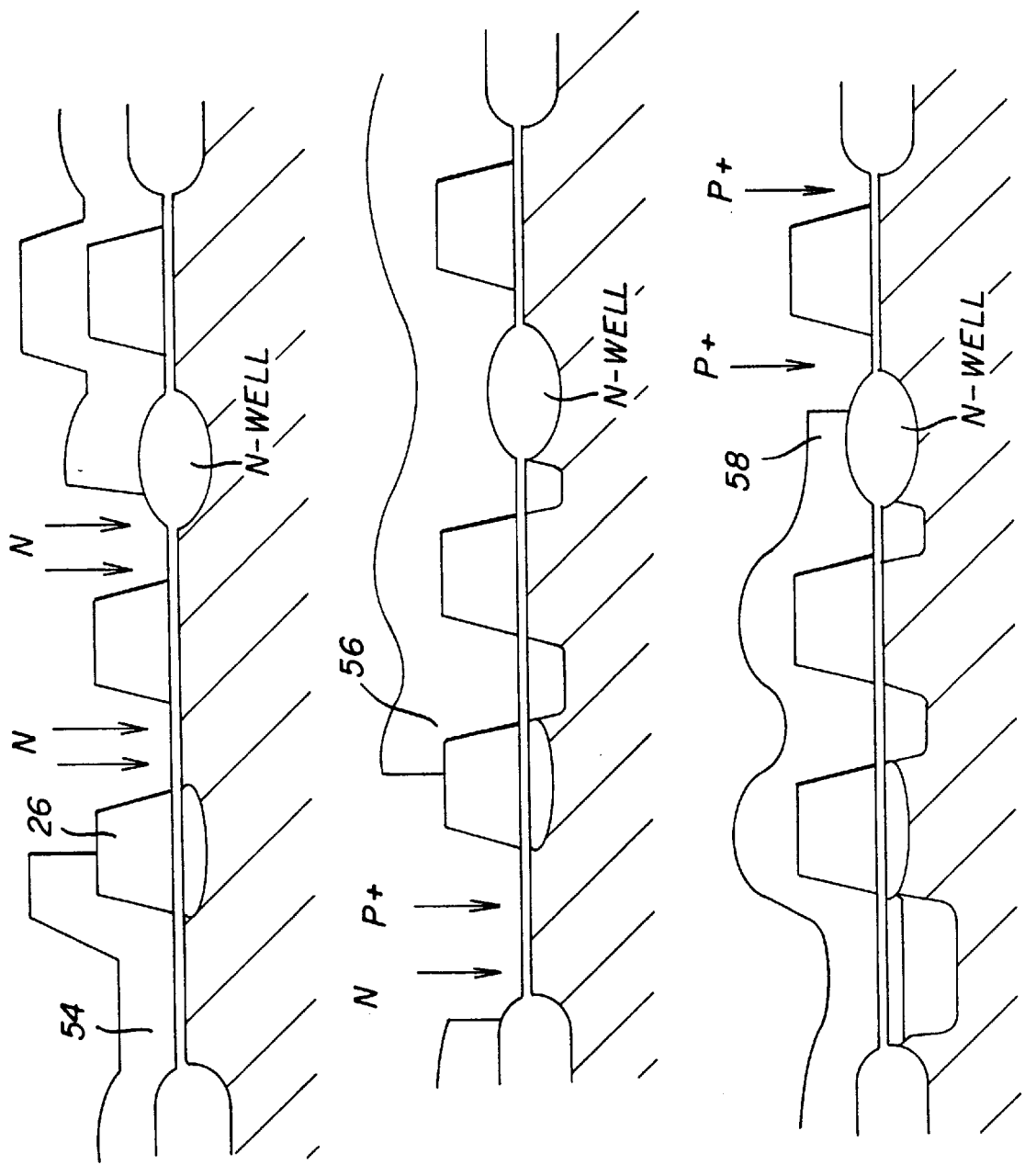

ACTIVE PIXEL SENSOR INTEGRATED WITH A PINNED PHOTODIODE

CROSS REFERENCE TO RELATED APPLICATIONS

This is a continuation of application Ser. No. 08/421,173, filed Apr. 13, 1995 now U.S. Pat. No. 5,625,210 entitled "Active Pixel Sensor Integrated With A Pinned Photodiode" by Paul P. Lee, et al.

FIELD OF THE INVENTION

The present invention relates to image sensing devices, and more particularly, to the integration of pinned photodiode technology within CMOS technology.

BACKGROUND OF THE INVENTION

Active pixel sensors refer to electronic image sensors within active devices, such as transistors, that are associated with each pixel. An active pixel sensor has the advantage of being able to easily incorporate signal processing and decision making circuitry on the same chip. Conventional active pixel sensors typically employ polysilicon photocapacitors or photodiodes as the active image sensing elements. These conventional active pixel sensors suffer from poor blue color response, high dark current and image lag.

Pinned photodiodes have been employed within charge coupled devices and have shown advantages in the area of color response for blue light, dark current density and image lag. For this reason pinned photodiodes are normally associated with high performance image sensors. Heretofore, pinned photodiodes have typically been employed as photoelements for charge coupled devices. An example of such a use of a pinned photodiode can be seen in THE PINNED PHOTODIODE FOR AN INTERLINE-TRANSFER CCD IMAGE SENSOR, by Burkey et al., IEDM 84, 1984, pages 28–31. However, charge coupled device technology lacks in the amount and type of circuitry elements that can be placed on a device.

From the foregoing discussion it should be apparent that there remains a need within the art of semiconductors for a pinned photodiode employed within a semiconductor technology that can provide advanced circuitry elements.

SUMMARY OF THE INVENTION

The present invention overcomes the shortcomings of the prior art by providing for the optimization of two technologies (CMOS and CCD) wherein a pinned photodiode is integrated into the image sensing element of an active pixel sensor. Pinned photodiodes are normally fabricated with CCD technology. By incorporating the appropriate process steps, a pinned photodiode can be integrated into the active pixel architecture. To improve the blue response and the dark current limitations of the active pixel sensor, a new CMOS imager has been integrated with a pinned photodiode using a mixed process technology. This technology combines CMOS and CCD processes to provide the best features from both technologies.

BRIEF DESCRIPTION OF THE DRAWINGS

FIG. 3a through FIG. 3g illustrate the various process steps employed in creating the device of FIG. 2.

DESCRIPTION OF THE PREFERRED EMBODIMENT

It has been discovered that technological features of a charge coupled device (CCD) can be employed to CMOS type semiconductors to create an active pixel sensor having a pinned photodiode.

Figure 1:
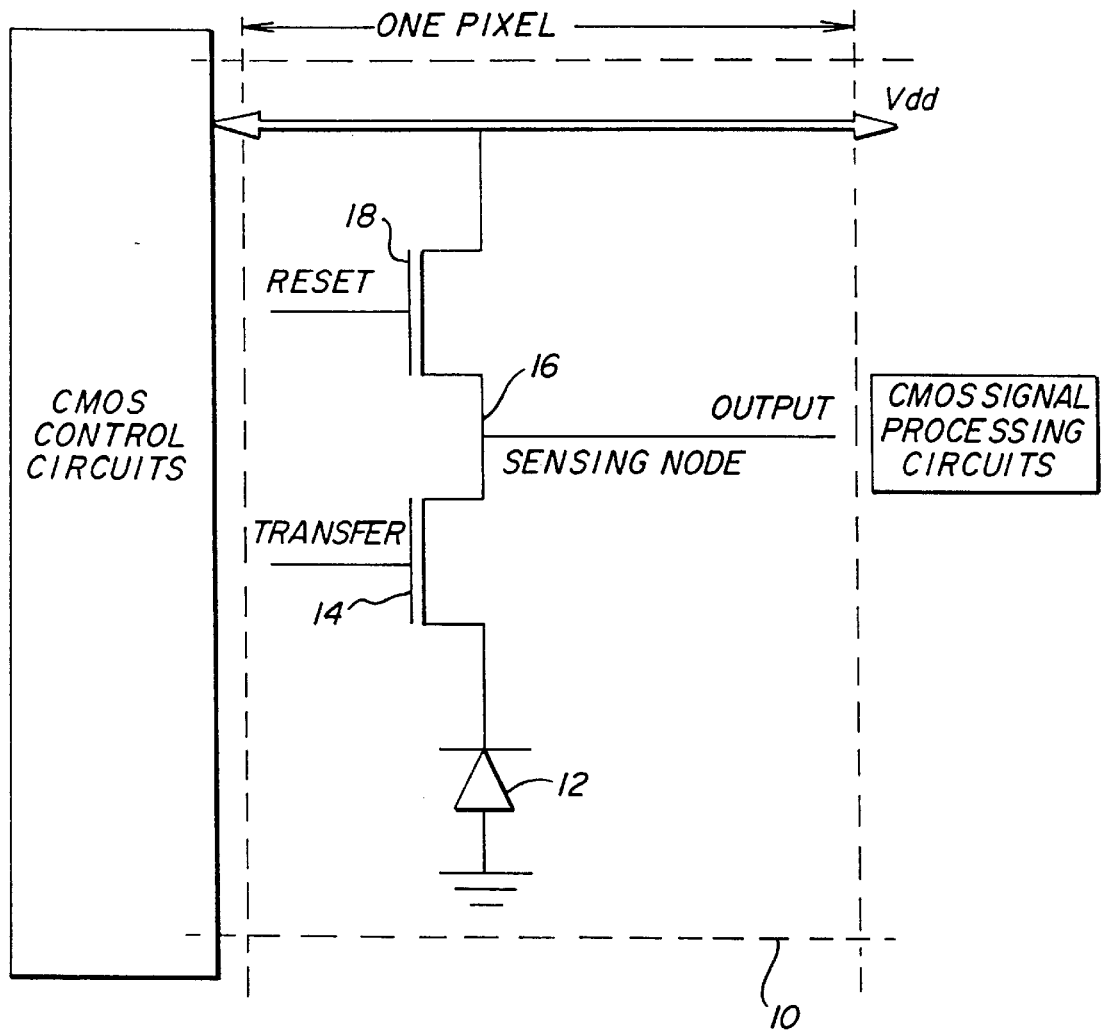
FIG. 1 is a schematic diagram of the pinned photodiode based active pixel sensor of the present invention.

FIG. 1 shows a schematic diagram of the pinned photodiode based active pixel sensor of the present invention, as employed within a CMOS based signal processing system. To improve the blue response, reduce lag and minimize the dark current characteristics of the active pixel sensor, a new CMOS imager has been integrated with a pinned photodiode 12 using a mixed process technology. This combines n-well CMOS technology and a pinned photodiode process to provide a sensor having the best features from both technologies. An n×m pinned photodiode active pixel sensor can be designed and fabricated, where n and m are number of pixels on the edges of the sensor. The present invention has advantages by incorporating image-sensor technology in CMOS active sensor.

Figure 2:
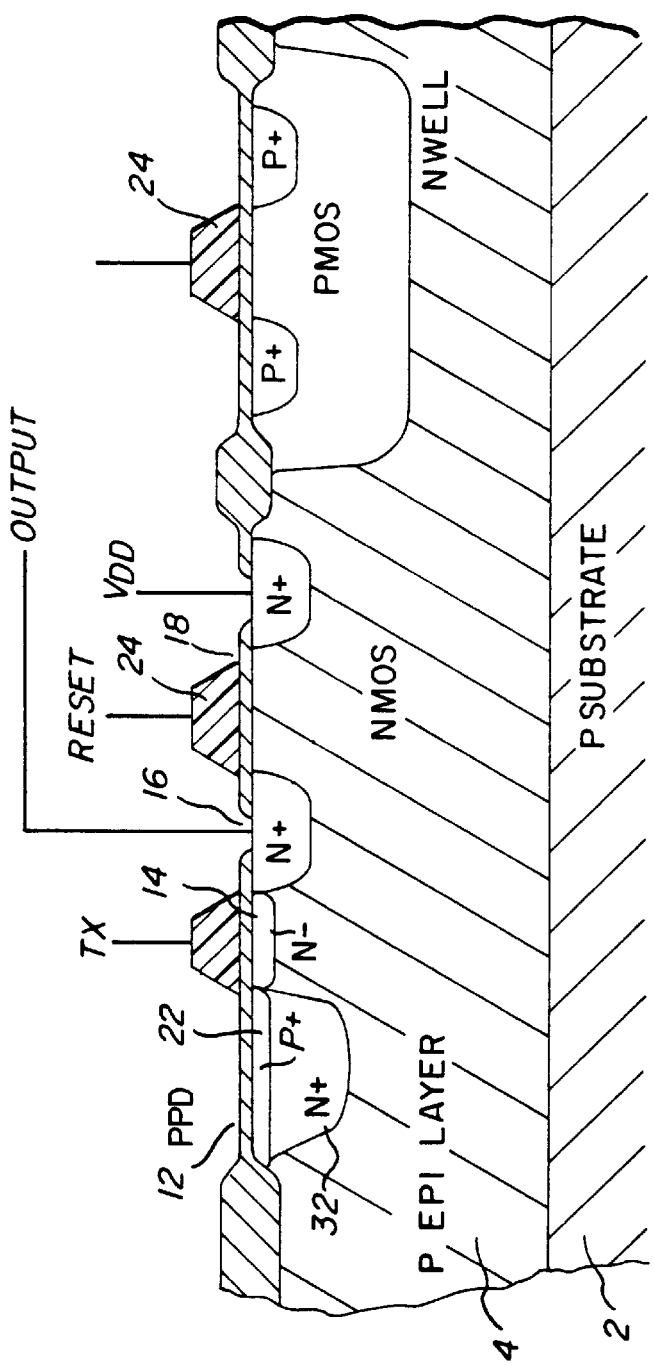
FIG. 2 is a cross sectional diagram of the devices used in creating the sensor of the present invention.

FIG. 2 illustrates a cross sectional diagram of the devices used in creating the sensor of the present invention. This is the result of integration of an active pixel sensor (APS) architecture typically fabricated in Complementary Metal Oxide Semiconductor (CMOS) technology with a pinned photodiode 12 (PPD) device using a mixed process technology. This new technology allows mixing of CMOS and high performance Charge-Coupled Device (CCD) modules. The PPD 12 becomes the photoactive element in an XY-addressable area array with each pixel containing active devices for the transfer 14, readout via floating diffusion 16, and reset 18 functions. An n-well CMOS technology was combined with the CCD process to provide the best features from both technologies. By replacing the polysilicon photocapacitor or photogate in conventional APS with the pinned photodiode 12, deficiencies in poor blue response, image lag and high dark current are minimized.

A buried-channel photocapacitor (not shown) biased in the accumulation mode would not have the limitations in dark current that CMOS technology has. A buried channel photcapacitor has essentially equivalent dark current characteristics to the PPD. The blue response problem can also be eliminated by using transparent gating material. An example of such a material would be Indium Tin Oxide (ITO). Therefore, employing both a buried channel photocapacitor with a transparent gate electrode provides for superior characteristics for blue light response and dark current, similar to those achieved by the PPD. Both the buried channel photocapacitor with a transparent gate and the PPD are devices typically associated with CCD technology. The present invention incorporates these devices from the CCD technology with CMOS processing capabilities. The construction of a active pixel sensor employing a buried channel photcapacitor would be similar to the PPD in FIG. 2 with the photocapacitor structured much like the transfer gate of the PPD embodiment. The transfer gate of the photocapacitor embodiment then would be without the buried channel of the transfer gate used by the PPD embodiment.

The process integration mixes the two technologies resulting in performance which is comparable to that obtained by each of the conventional processes, individually. This was demonstrated on linear image sensors and CMOS test circuits.

In the mixed process technology, schematic representation of the process flow is given in FIGS. 3a through 3g.

Figure 3A:
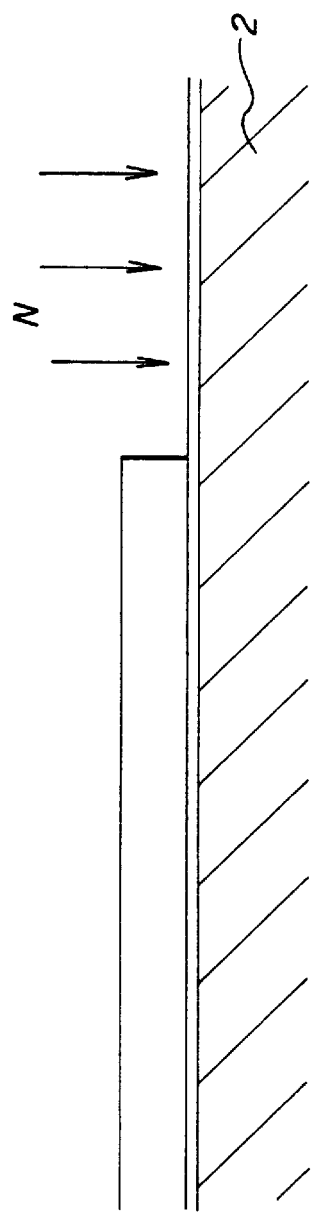

FIG. 3a illustrates the patterning and ion implantation used within the present invention to form n-well 40 which is used to contain the PMOS transistors that will form part of the control circuits of present invention.

FIGS. 3b and 3c show the patterning and growth of isolation oxide/field oxide which is used for isolating devices to be formed on the silicon layer 2 with or without epitaxial layers and with or without wells structures.

FIG. 3d illustrates the patterning and ion implantation of an n-type buried channel 15 which is used to form the transfer gate 14 of the pixel within the present invention. After the implantation of the buried channel 15, photoresist layer 52 is removed and a polysilicon layer 26 is formed upon the substrate. The polysilicon 26 is used to form local interconnects and the gates of transistors. Both PMOS and NMOS transistors will have their gates formed by this polysilicon 26.

FIG. 3e shows the patterning of the polysilicon 26 with photoresist 54 and implantation of N+ dopant to form source and drain regions. This results in source and drain regions that are self aligned to the remaining polysilicon 26. This forms the NMOS transistors within the preferred embodiment.

FIG. 3f show the construction of the PPD by patterning with photoresist 56 areas for two additional implants. The first implant is to create a photodiode by implanting a deeper N+ impurity than was previously used by the source and drain implants discussed above. The deeper implant yields substantial increases in photo response due to an increase collection path for the incident photo carriers with the deeper implant. A pinning layer 22 implant is then made using high doses of low energy P+ dopant that remains near the surface of the photodiode 32.

FIG. 3g shows the patterning with photoresist 58 and the following ion implantation of the source/drains of the PMOS transistors. As with the NMOS transistors, the source/drain implants for the PMOS transistors are self aligned with the selected polysilicon. P+ implant are used to construct the PMOS transistors.

The device is completed by the appropriate planarization and metalization steps.

Figure 4:
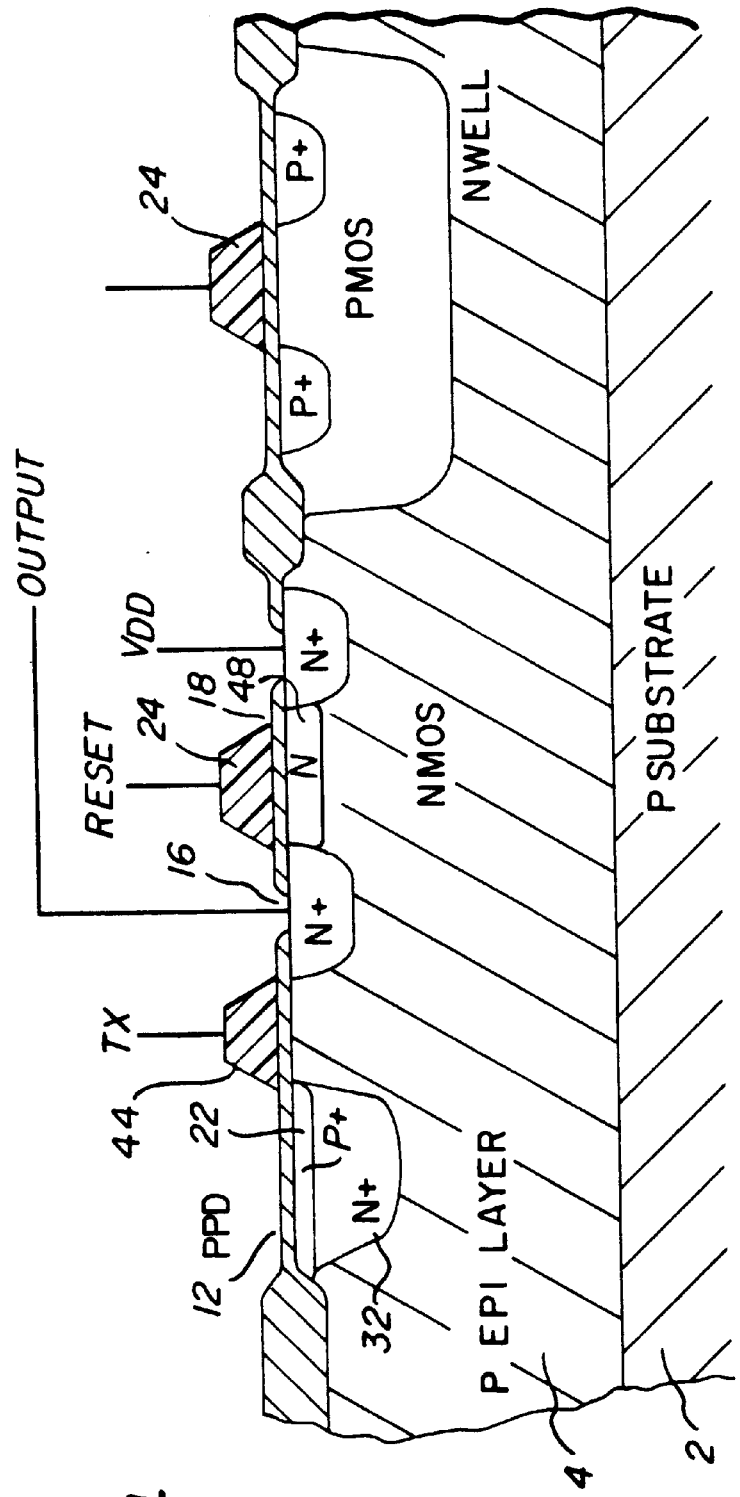
FIG. 4 is a cross sectional diagram of the present invention employing a surface channel transfer gate and a buried channel reset gate.

Referring to FIG. 4, which is a cross sectional diagram of the present invention employing a surface channel transfer gate 44 and a buried channel reset gate 48, this representation is analogous to the present invention as shown in FIG. 2 with the doping profiles of the transfer gate and reset gate reversed.

FIG. 4 illustrates transfer gate 44 constructed on the surface of the sensor. This has advantages of allowing the transfer gate to be shorter than with the buried channel based transfer gate 14 previously discussed. This results in allowing more room for the pinned photodiode resulting in a higher fill factor for the device. The surface channel transfer gate 44 also creates a pinned photodiode having a larger charge capacity. The larger charge capacity results from transfer gate 44 having a shallower electrostatic potential when in an off state, when 0 volts is applied to the transfer gate 44. However, there is a disadvantage to the surface channel transfer gate 44 based architecture. The disadvantages are higher dark current from the transfer gate 4, and a mid level transfer gate signal required for antiblooming.

Still referring to FIG. 4, the buried channel reset gate 48 results in lower dark current, the ability to perform anti-blooming with the reset gate 24 off, and the ability to reset the floating diffusion 16 to the level of the reset drain. It is desirable to reset the level of the floating diffusion 16 to the reset drain, and a buried channel reset gate 24 enables this with the use of standard CMOS voltage levels. Otherwise a design choice would have to be made between using a higher reset gate voltage level or not being able to reset the floating diffusion to the level of the reset drain.

The embodiments shown in FIGS. 2 and 4 can also be modified to include features from each. For example, the reset gate can be either a buried channel or a surface channel. In a similar fashion the transfer gate can be constructed using either a buried channel or a surface channel.

The imager architecture of the present invention can be employed to signal processing circuitry of prior art devices to increase their overall performance. An example is the incorporation of the present invention into an earlier designs implemented at Jet Propulsion Laboratory. This earlier design is described in IEEE Transactions on Electron Devices, Vol. 41, No. 3, March 1994 (hereinafter referred to as JPL). While describing a photogate integrated into an active pixel sensor, the device as taught by JPL did not provide a sensor that yielded satisfactory blue wavelength color response. Additionally, the JPL device lacked sufficient low dark current noise characteristics. The present invention overcomes these shortcomings by incorporating pinned photodiode technology not conventionally applied within CMOS technology. This results in an image sensor having superior response for blue light and improved dark current noise characteristics.

While the best mode known to the inventor has been disclosed by the preferred embodiment, various modifications will be obvious to those skilled in the art. These obvious modifications should be considered in view of the appended claims.

Parts List 2 substrate
4 epitaxial layer
10 pixel
12 photodiode
14 transfer
15 channel
16 diffusion
18 reset
22 pinning layer
26 polysilicon
32 photodiode
40 n-well
44 transfer gate
48 buried channel reset gate
52 photoresist layer
54 photoresist
56 photoresist
58 photoresist

We claim:

1. A method of forming an active pixel sensor comprising the steps of:
   providing CMOS control circuitry operatively coupled through a transfer gate formed on a surface of the sensor to a pinned photodiode formed at the surface.

2. The method of claim 1 wherein the CMOS control circuitry is operatively coupled to an array of pinned photodiodes, each pinned photodiode being operatively coupled to the CMOS control circuitry through a transfer gate formed on the surface.

3. The method of claim 1 wherein charge is transferred from the pinned photodiode to a floating diffusion area under control of the transfer gate such that the pinned photodiode, the transfer gate and the charge sensing means acts as, respectively, the source, the gate and the drain of a MOSFET.

4. The method of claim 3 wherein the CMOS control circuitry is operatively coupled to the charge sensing means.

5. The method of claim 1 wherein the step of providing further comprises providing amplification means for applying charge from the pinned photodiode to the CMOS control circuitry in a predetermined manner.

6. The method of claim 1 wherein the step of providing further comprises providing a plurality of pinned photodiode elements formed into an array.

7. The method of claim 1 wherein the step of providing further comprises providing the pinned photodiode being operatively coupled to at least one NMOS control circuit.

8. The method of claim 1 wherein the step of providing further comprises providing the pinned photodiode being operatively coupled to at least one PMOS control circuit.

9. A method for integrating a pinned photodiode into an active pixel sensor comprising the steps of:

providing a semiconductor material of a first conductivity type with a series of masking layers including at least one conductive layer on a major surface of the substrate;

forming at least one well of a second conductivity type that is opposite the first conductivity type in an area where control circuitry is to be built, and forming an active area over the substrate;

patterning at least one transfer gate along the surface of the substrate and a series of local interconnections;

forming structures for a charge sensing means, including, creating patterns representing a first set of sources and drains for a predetermined set of transistors, including at least one drain for each of the transfer gates;

introducing a second conductivity type opposite the first conductivity type so as to create the first set of sources and drains;

patterning at least one image sensing area adjacent to the transfer gate;

introducing within at least the image sensing area a material of the second conductivity type to create a photodiode;

introducing at least on top of the photodiode a pinning layer comprising the first conductivity type;

creating patterns representing a second set of sources and drains for a predetermined set of transistors;

introducing the first conductivity type to create the second set of sources and drains; and creating a predetermined set of contacts on first and second sets of sources and drains.

10. The method of claim 9 further comprising the step of providing a transfer region of the first conductivity type along the surface of the transfer gate.

11. The method of claim 10 wherein the step of introducing on top of the photodiode a pinning layer further comprises introducing the first conductivity type such that it has at least one edge that is self aligned with the transfer region and creates a region of the first conductivity type at the surface of the second conductivity type.

12. The method of claim 9 wherein the step of forming structures further comprises the drain being a floating diffusion region.

13. The method of claim 9 wherein the steps relating to introducing the first and second sets of sources and drains are reversed.

14. The method of claim 1 wherein the step of providing further comprises providing a reset transistor operatively coupled to a charge sensing node and the pinned photodiode.

* * * * *